United States Patent [19]

Tanaka

[11] Patent Number: 5,204,504
[45] Date of Patent: Apr. 20, 1993

[54] HIGH-FREQUENCY HEATING APPARATUS INCLUDING RINGING EFFECT SUPPRESSOR FOR SWITCHING ELEMENT

[75] Inventor: Teruya Tanaka, Yokohama, Japan
[73] Assignee: Kabushiki Kaisha Toshiba, Kawasaki, Japan
[21] Appl. No.: 398,506
[22] Filed: Aug. 25, 1989

[30] Foreign Application Priority Data
Aug. 26, 1988 [JP] Japan .................................. 63-212043

[51] Int. Cl.⁵ ........................ H05B 6/68; H05B 6/08
[52] U.S. Cl. .......................... 219/10.55 B; 219/10.77; 219/10.493; 363/21; 363/97; 323/289
[58] Field of Search ............... 219/10.55 B, 10.77, 219/10.493; 363/21, 97, 131; 323/289

[56] References Cited

U.S. PATENT DOCUMENTS

| Re. 32,904 | 4/1989 | Pacholok | 323/289 |
|---|---|---|---|
| 4,312,029 | 1/1982 | Zellmer | 363/21 |
| 4,630,186 | 12/1986 | Kudo | 323/289 |
| 4,882,663 | 11/1989 | Nilssen | 219/10.55 B |
| 4,900,884 | 2/1990 | Aoki | 219/10.493 |
| 4,903,182 | 2/1990 | Pilukaitis et al. | 363/19 |
| 4,954,917 | 9/1990 | Wirth | 361/98 |

FOREIGN PATENT DOCUMENTS 58-198888  11/1983  Japan .

OTHER PUBLICATIONS

H. Yamashita et al., "An Induction Heating Single Ended Push-Pull Resonant Inverter Using IGBT, " *PCIM'88 Proceedings*, 1988, pp. 82-90.

*Primary Examiner*—Philip H. Leung
*Attorney, Agent, or Firm*—Foley & Lardner

[57] ABSTRACT

In an inverter type high frequency heating apparatus such as an electromagnetic cooker and a microwave oven, an insulated gate bipolar transistor is employed as a switching element. A parallel circuit arranged by a capacitor and a resistor is interposed between a gate electrode of the gate insulated bipolar transistor and a gate driver circuit so as to prevent a power loss, or ringing effect when the gate insulated bipolar transistor is turned off.

19 Claims, 8 Drawing Sheets

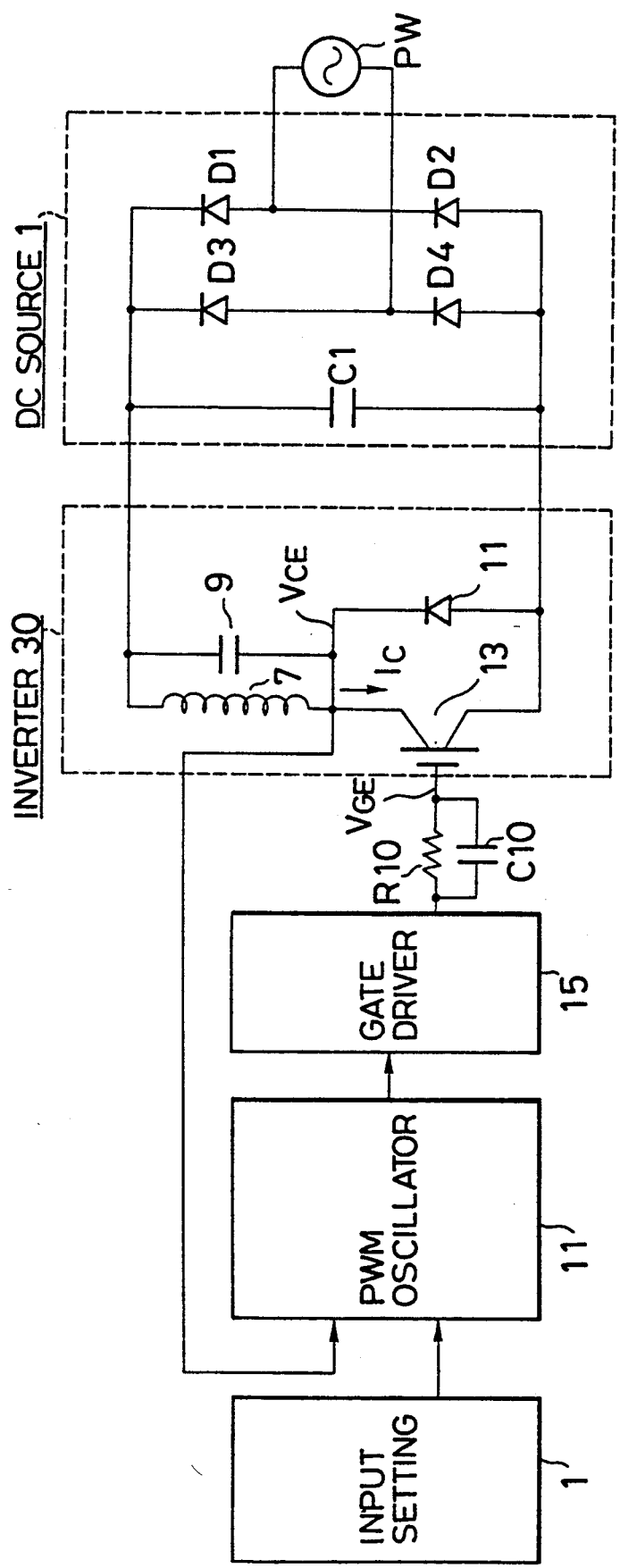

HIGH-FREQUENCY HEATING APPARATUS INCLUDING RINGING EFFECT SUPPRESSOR FOR SWITCHING ELEMENT

BACKGROUND OF THE INVENTION

1. Field of the Invention

The present invention generally relates to a high-frequency heating apparatus, e.g., an electromagnetic induction cooker and a microwave oven. More specifically, the present invention is directed to a high-frequency heating apparatus including a ringing-effect suppressor for a switching element such as an insulated gate bipolar transistor (IGBT), in which an article to be heated such as a metal pan or food is heated by way of an electromagnetic induction effect, or dielectric heating effect.

2. Description of the Related Art

In a conventional inverter type high-frequency heating apparatus such as an electromagnetic cooker and microwave oven, a quasi-E class inverter circuit is built therein, and this inverter circuit is turned ON/OFF in order to produce a desirable high-frequency current. Then, a metal pan or food is heated by way of the electromagnetic induction phenomenon or dielectric phenomenon.

In the conventional quasi-E class inverter circuit, there is employed a bipolar type NPN/PNP transistor functioning as a switching element. Under this circuit condition, the current capacity of this bipolar type switching transistor is inherently not so high, but also the switching speed thereof is not either high. As a consequence, there are problems in such a quasi-E class inverter circuit employing the normal bipolar type switching transistor that the high input power, namely high RF output power is not available. Thus, difficulties exist in the allowable heating power to heat the article to be heated. In other words, the high heating power is not available from the quasi-E class inverter including the normal bipolar type switching transistor.

To overcome the drawbacks, an insulated gate bipolar transistor (referred to as an "IGBT") has newly been utilized as the switching element in the conventional inverter circuit of the high-frequency induction/dielectric heating apparatus, since this insulated gate bipolar transistor has a higher withstand voltage, as compared with the above-described bipolar type PNP/NPN transistor.

FIG. 1 represents an electromagnetic cooker employing the insulated gate bipolar transistor in the DC/AC inverter circuit. This conventional electromagnetic induction cooker is known from, for instance, "AN INDUCTION HEATING SINGLE ENDED PUSH-PULL RESONANT INVERTER USING IGBT" by Yamashita et al, pages 82 to 90, PCIM'88 PROCEEDINGS, 1988.

In the known electromagnetic induction cooker shown in FIG. 1, a DC voltage having a predetermined value derived from a DC power supply circuit 101 is applied to a DC-to-AC inverter circuit 103. Both a heating coil 107 and a resonant capacitor 109 are brought into a series resonant condition by turning ON/OFF an IGBT 113 under the control of a gate driver circuit 115. As a result, the electromagnetic induction effect is caused by the magnetic flux produced from the heating coil 107 so that the eddy current occurs in a metal pan 100 mounted on the heating coil 107. Thus, food stored in this metal pan 100 can be heated.

Referring back to the circuit shown in FIG. 1, a pulse width modulation oscillator 119 (referred to as "a PWM oscillator") modulates a pulse width of an oscillated pulse signal in response to a setting signal derived from an input setting circuit 121. In response to the PWM pulse signal from the PWM oscillator 119, the gate driver circuit 115 turns ON IGBT 113 for a time period determined by the pulse width of the PWM pulse signal.

In FIG. 2, there is shown an equivalent circuit diagram of the insulated gate bipolar transistor 113 employed as the switching element of the DC-to-AC inverter 103. The insulated gate bipolar transistor 113 is constructed of a MOS (Metal Oxide Semiconductor) FET (Field Effect Transistor) 101, a PNP type bipolar transistor TR101 and a resistor R101 connected between the MOSFET 101 and PNP transistor 101. A pulse signal having the voltage that varies from a zero volt to 15 volts and derived from the gate driver circuit 115 is applied to the gate terminal PC of IGBT 113. As represented in FIG. 3A, when the pulse signal having the voltage higher than the threshold voltage "$V_{TH}$", for instance, 3 volts is input to the gate terminal "PG" of IGBT 113, the MOS field effect transistor FET101 is, first of all, turned ON which is located at the front stage of this equivalent circuit. Then, when the MOS field effect transistor FET101 is turned ON, the followed PNP transistor TR101 is turned ON. Thus, the collector current "$I_C$" of IGBT 113 is increased in a straight line form, as illustrated in FIG. 3B.

After a predetermined time period has passed, when the pulse voltage of the pulse signal output from the gate driver circuit 115 is decreased from 15 volts to a zero volt, IGBT 113 is turned OFF. As a result, the voltage between the collector and emitter of the PNP transistor TR101, namely the resonant voltage "$V_{CE}$" is obtained as a sinusoidal waveform during the turn-OFF period of IGBT 113, as represented in FIG. 3C.

In case that the electromagnetic cooker shown in FIG. 1 is driven under the source voltage of 200 V at the maximum power of 2KW, the maximum resonant voltage "$V_{CE}$" is amount to approximately 1,000 V as shown in FIG. 3C.

As is known in the art, in general, a predetermined capacitance is present between a gate electrode and an emitter of an MOS field effect transistor FET constituting an insulated gate bipolar transistor IGBT. Moreover, an inductance exists in the wiring materials, or wiring patterns between the gate electrode of the MOS field effect transistor FET 101 and the gate driver circuit 115. As a consequence, a so-called "ringing effect" may occur in the gate voltage "$V_{GE}$" of IGBT 113 due to the above-described capacitance and inductance. That is to say, even when the pulse voltage of the pulse signal output from the gate driver circuit 115 is reduced from 15 V to a zero V, the gate voltage $V_{GE}$ of IGBT 113 would not be reduced to a zero volt precisely, and there are produced noise signal components in the gate voltage $V_{GE}$ around the threshold voltage $V_{TH}$. In addition to the above-described problem of the conventional high-frequency heating apparatus, there is another problem. That is, since the gate driver circuit 115 is positioned adjacent to the heating coil 107, the peak voltage caused by the above-explained ringing effect may be increased, or amplified by receiving the magnetic flux produced from the juxtaposed heating coil 107.

When, for instance, the pulse voltage of the pulse signal output from the gate driver circuit 115 is lowered to a zero volt and the gate voltage $V_{GE}$ of IGBT 113 becomes lower than the threshold voltage $V_{TH}$, this IGBT 113 is once turned OFF. However, this gate voltage $V_{GH}$ exceeds over this threshold voltage $V_{TH}$ due to the above-described ringing effect and thus the field effect transistor FET 101 shown in FIG. 1 is again turned ON and therefore, a current flows through a diode constructed of the emitter and base electrode of the bipolar transistor TR101.

As previously described, in case that the electromagnetic cooker is operated under the main voltage of 200V and the maximum 2KW input power, the resonant voltage is produced at 200 V in a time period "$T_o$" during which the ringing effect occurs. As a consequence, the collector current "$I_C$" of 20A, or near value thereof flows due to the ringing effect and thus a very high power loss may be produced.

Even in case that another conventional electromagnetic cooker is operated under the main voltage of 100V and the maximum input power of 1.2KW, a similar high power loss may occur due to the ringing effect.

Also, in the conventional microwave oven employing the inverter system, namely an insulated gate bipolar transistor as a switching element, a large power loss may occur because of the ringing effect, as previously explained.

Since IGBT 113 is heated due to such a power loss when IGBT 113 is turned OFF, a large heat sink mounted to IGBT 113 is required and also a great cooling fan is necessarily needed.

SUMMARY OF THE INVENTION

The present invention has been made in an attempt to solve the above-described problems, and therefore, has an object to provide a compact and low-cost inverter type high frequency heating apparatus. In accordance with such an inverter type high frequency heating apparatus, a power loss caused when an insulated gate bipolar transistor functioning as a switching element is turned OFF can be reduced.

To achieve the above-described object, a high-frequency heating apparatus according to the present invention comprises:

DC (direct current)-to-AC (alternating current) inverter means (3) having an insulated gate bipolar transistor (13), for inverting DC power into high frequency AC power utilizing a resonant phenomenon by switching the insulated gate bipolar transistor (13) at a predetermined high frequency;

driver means (15) for driving a gate electrode of the insulated gate bipolar transistor (13);

removing means (C10) interposed between the driver means (15) and the gate electrode of the insulated gate bipolar transistor (13), for removing an electron remaining between the gate electrode of the insulated gate bipolar transistor (13) and an emitter thereof when the insulated gate bipolar transistor (13) is turned OFF; and, suppressing means (R10) connected parallel to the electron removing means (C10), for suppressing vibrations contained in a gate voltage ($V_{GE}$) of the insulated gate bipolar transistor (13) when the insulated gate bipolar transistor (13) is turned OFF.

In accordance with the inverter type high frequency heating apparatus as described above, a high frequency power generating means is connected to a switching means constructed of an insulated gate bipolar transistor, and an article such as food is heated by the high frequency current supplied from the high frequency power generating means while this switching means is turned ON/OFF to produce an eddy current in a metal pan for storing the food, therein. The high frequency heating apparatus according to the invention further comprise a means for removing an electron remaining between the gate electrode and emitter of the insulated gate bipolar transistor, and also a means for suppressing vibrations in the gate voltage thereof when the insulated gate bipolar transistor is turned OFF. The employment of these electron removing means and vibration suppressing means can reduce a power loss of IGBT caused when the insulated gate bipolar transistor is turned OFF.

BRIEF DESCRIPTION OF THE DRAWINGS

For a better understanding of the present invention, reference is made to the following descriptions in conjunction with the accompanying drawings, in which:

FIG. 7 is a schematic block diagram of another electromagnetic cooker according to a second preferred embodiment of the invention; and, FIG. 8 is a schematic block diagram of a microwave oven according to a third preferred embodiment of the invention.

DETAILED DESCRIPTION OF THE PREFERRED EMBODIMENTS

ELECTROMAGNETIC COOKER

Figure 4:
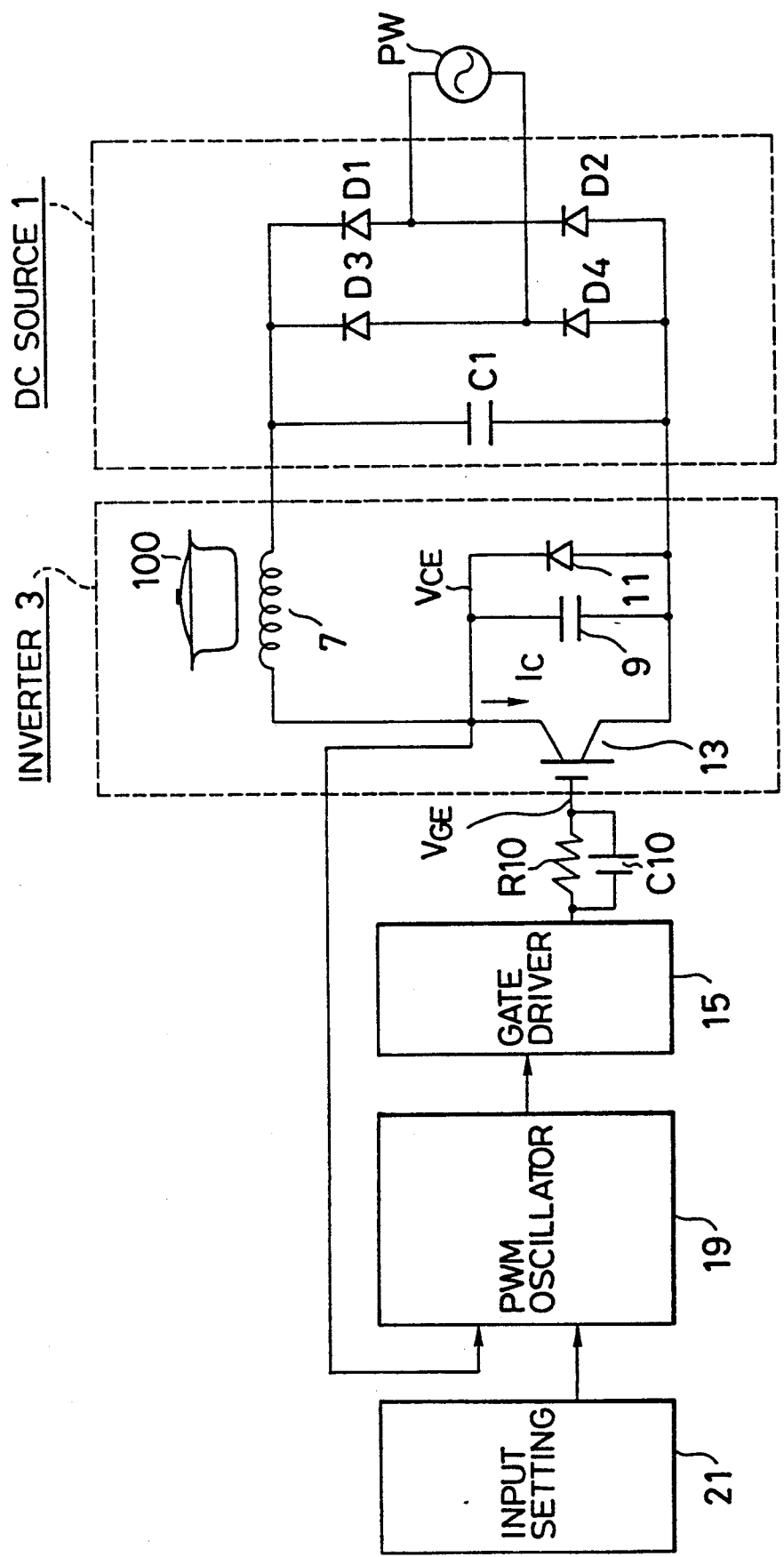
FIG. 4 is a schematic block diagram of an electromagnetic cooker according to a first preferred embodiment.

Referring now to FIG. 4, an arrangement of an electromagnetic cooker to which the present invention has been applied will be described.

Figure 1:
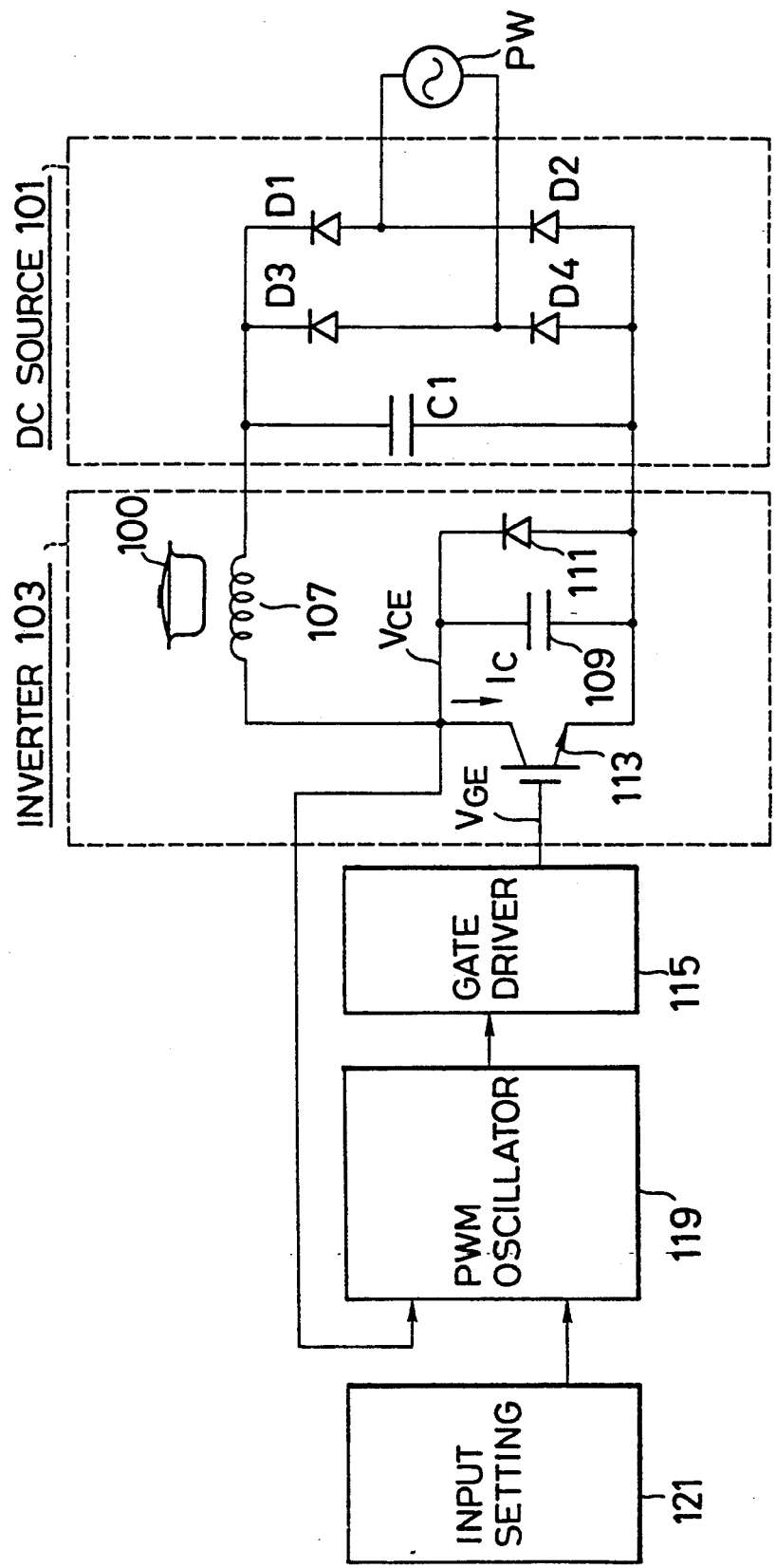
FIG. 1 is a schematic block diagram of a conventional electromagnetic cooker.
Figure 2:
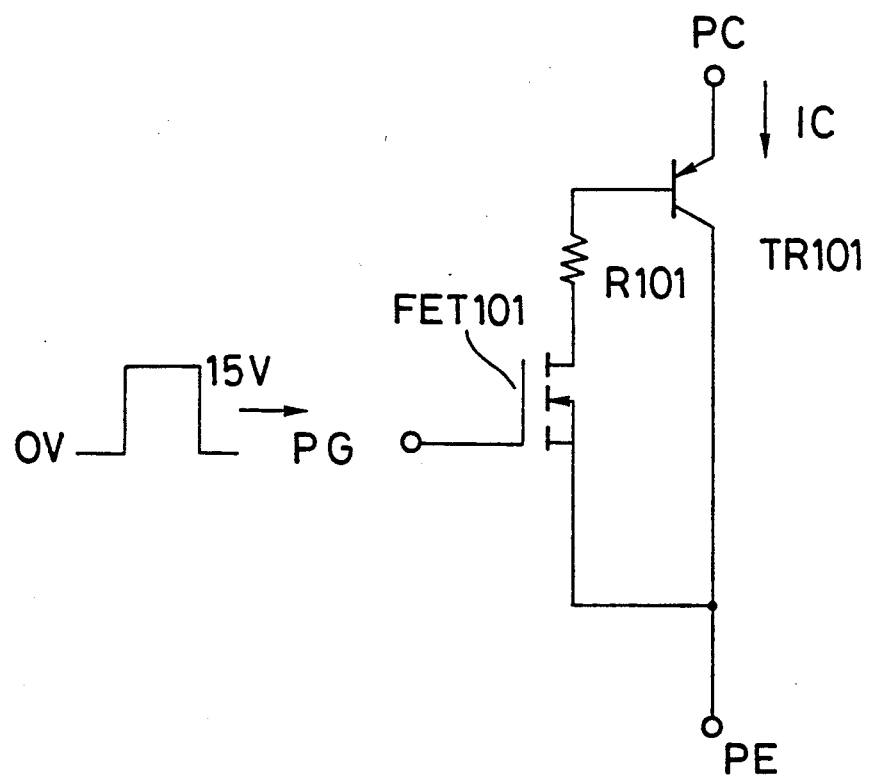
FIG. 2 is an equivalent circuit of an insulated gate bipolar transistor functioning as a switching element.
Figure 3A:
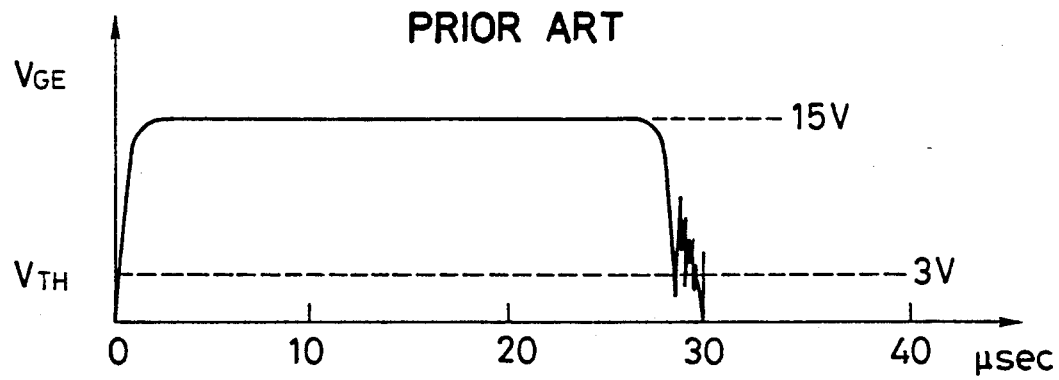
FIGS. 3A to 3C are waveform charts for explaining the ringing effect occurring in the conventional electromagnetic cooker shown in FIG. 1.
Figure 3B:
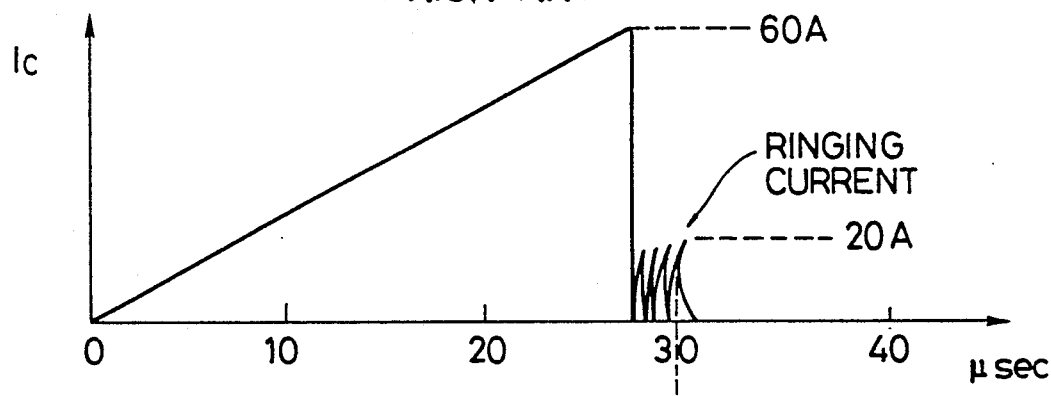
Figure 3C:
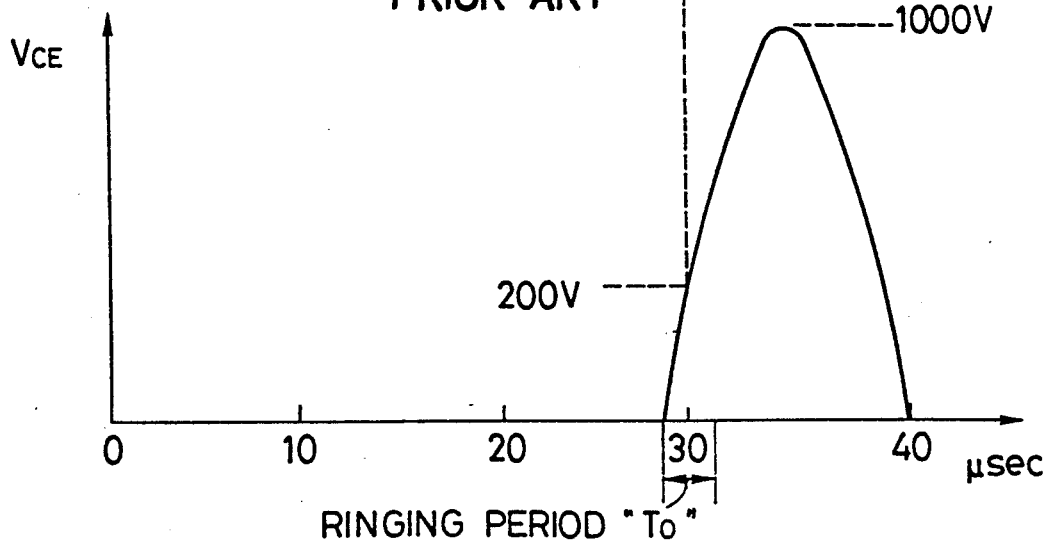

A commercial power supply "PW" capable of supplying an AC (alternating current) voltage such as 200 V is coupled to a DC (direct current) source 1. This DC source 1 is connected to a DC-to-AC inverter circuit 3. The DC source 1 is constructed of bridge-connected four diodes D1, D2, D3, and D4, and also a smoothing capacitor C1, and converts the AC power supplied from the commercial power supply "PW" into DC power. This DC source 1 supplies the converted DC power to the inverter circuit 3. In the DC/AC inverter circuit 3, a heating coil 7 and a series resonant capacitor 9 are connected series to each other, and an insulated gate bipolar transistor 13 functioning as a switching element is connected parallel to the series resonant capacitor 9. A damper diode 11 is connected to the series resonant capacitor 9. It should be noted that since an equivalent circuit of this insulated gate bipolar transistor 13 is similar to that of the above-described bipolar transistor 113 shown in FIG. 2, no further explanation is made in the following description.

An idea of the electromagnetic heating operation will now be explained. That is, while the insulated gate bipolar transistor 13 is turned ON/OFF, or switched at a predetermined high frequency, both the heating coil 7 and series resonant capacitor 9 are brought into the series resonant condition. In accordance with the electromagnetic induction effect caused by the magnetic flux produced from the heating coil 7 which is driven by IGBT 13, the metal pan 100 mounted adjacent to this heating coil 7 induces an eddy current in their metal frame, and therefore an article such as food stored in this metal pan 100 is heated due to the eddy current loss.

POWER LOSS PREVENTING CIRCUIT

As a major feature of the preferred embodiment, there is employed a power loss preventing means interposed between the DC/AC inverter circuit 3 and a gate driver circuit 15, by which the power loss occurring when the insulated gate bipolar transistor 13 is turned OFF can be prevented. More specifically, a resistor R10 is interposed between the gate electrode of the insulated gate bipolar transistor 13 and the gate driver circuit 15, and also a capacitor C10 is connected parallel to this resistor R10. A capacitance of this capacitor C10 is so selected as to be equal to a capacitance between the gate electrode and the emitter of the insulated gate bipolar transistor 13. The function of this capacitor C10 is to immediately charge therein an electron remaining between the gate electrode of the field-effect transistor FET101 (see FIG. 2) and the emitter thereof when the insulated gate bipolar transistor 13 is turned OFF. In other words, this capacitor C10 corresponds to a removing means for removing an electron existing between the gate electrode and emitter of the insulated gate bipolar transistor 13 when this bipolar transistor 13 is turned OFF.

The resistor R10 connected parallel to the above-described electron removing capacitor C10 functions as a so-called "damping resistor". This damping resistor R10 suppresses the ringing phenomenon caused by the residual impedance, namely both the above-described capacitance and an inductance which exists in wiring patterns or wiring materials between the gate driver circuit 15 and the inverter circuit 3.

In other words, this resistor R10 corresponds to a suppressing means for suppressing the vibrations contained in the gate voltage $V_{GE}$ of the insulated gate bipolar transistor 13 when this transistor 13 is turned OFF. A parallel circuit arranged by the resistor R10 and capacitor C10 is interposed between the gate electrode of the insulated gate bipolar transistor 13 and gate driver circuit 15 so as to lower the gate voltage $V_{GE}$ to a zero volt when the gate insulated bipolar transistor 13 is turned OFF, and also to immediately and surely turn OFF this transistor 13. As a result, a power loss caused by this ringing effect, namely a switching loss of the gate insulated bipolar transistor 13 can be prevented.

A junction point between the heating coil 7 and insulated gate bipolar transistor 13 is connected to a pulse width modulation oscillator 19 to form a feedback path. Thus, the resonant voltage "$V_{CE}$" (see FIG. 6C) produced by the above-described series resonant phenomenon is fed back to the pulse width modulation oscillator 19. Although not shown in FIG. 4, this pulse width modulation oscillator 19 includes an oscillator, the oscillation pulse period of which is corrected in response to this resonant voltage which has been fed back from the inverter circuit 3. The pulse width modulation oscillator 19 is also connected to an input setting circuit 21 so as to modulate a pulse width of the corrected oscillation pulse in response to an input setting signal derived from the input setting circuit 21.

The pulse width modulation oscillator 19 is connected to the gate driver circuit 15. Thus, the gate driver circuit 15 enables the insulated gate bipolar transistor 13 to be turned ON during a time duration defined by the above-described pulse width of the pulse signal.

In the above-described preferred embodiment, the capacitance of the capacitor C10 functioning as the remaining electron removing means is selected to be 0.01 microfarads, whereas the resistance value of the damping resistor R10 is selected to be 10 ohms and the main supply voltage is 200 V.

GATE DRIVER CIRCUIT

Figure 5:
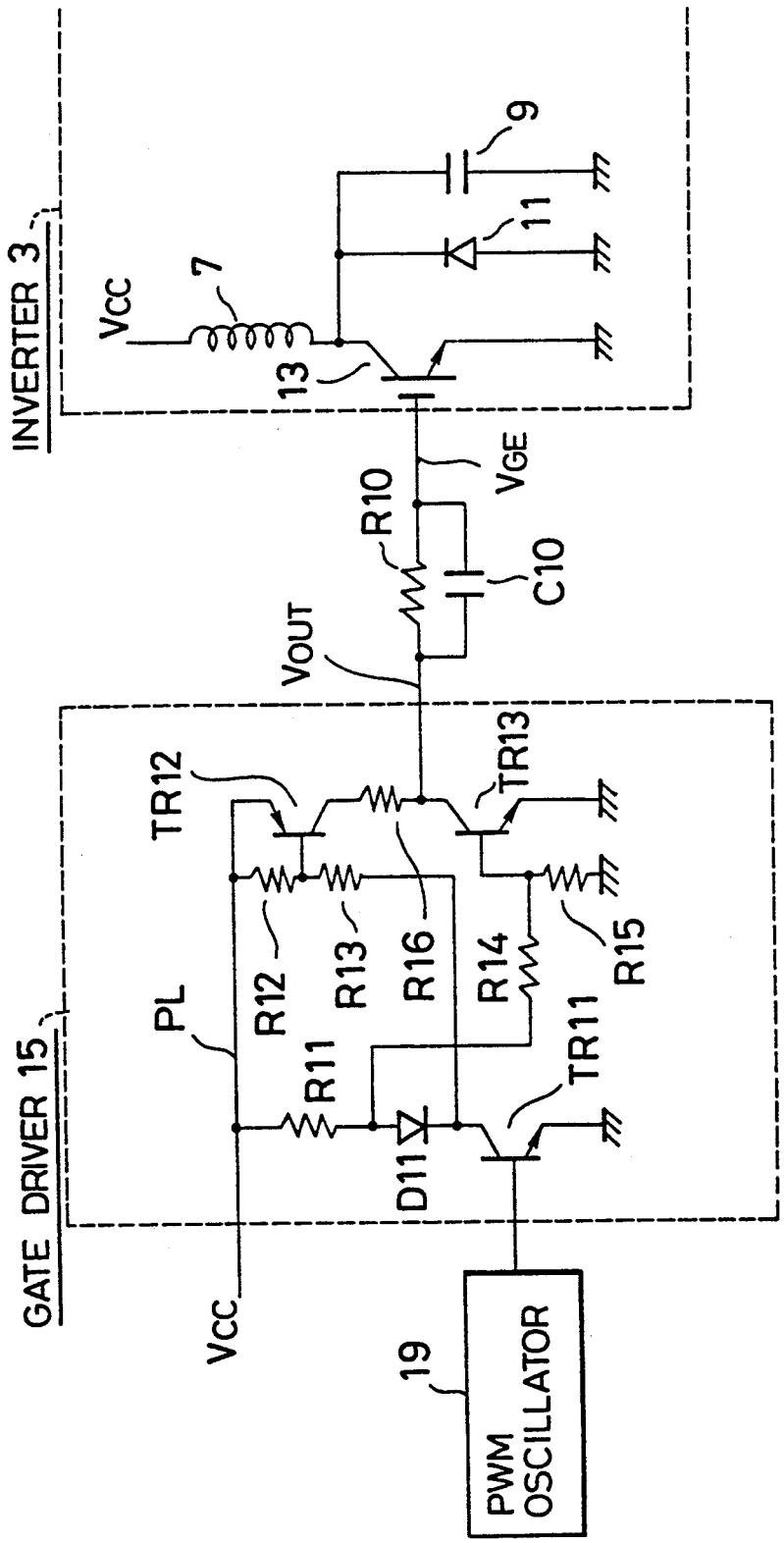
FIG. 5 is a circuit diagram of an internal circuit arrangement of the switching driver 15 employed in the electromagnetic cooker illustrated in FIG. 4.

Referring now to FIG. 5, an internal circuit of the above-described gate driver circuit 15 and also a peripheral circuit thereof will be described.

In the gate driver circuit 15, a resistor R11, a diode D11, and an NPN type bipolar transistor TR11 are series-connected between a ground line and a power supply line "RL" to which a predetermined DC voltage, e.g., plus 15 volts are applied. The base electrode of this transistor TR11 is connected to the pulse width modulation oscillator 19, to which the above-described pulse signal is input. Between a cathode of the diode D11 and the power supply line "PL", a resistor R12 and another resistor R13 are series-connected. An NPN type bipolar transistor TR12 is connected via its base electrode to a junction point between these resistors R12 and R13. A resistor R14 and a resistor R15 are series-connected between an anode of the diode D11 and the ground line. A junction point between these resistors R14 and R15 is connected to a base electrode of an NPN type bipolar transistor TR13. The transistor TR12, resistor R16, and transistor TR13 are series-connected between the power supply line "PL" and ground line. A junction point between a collector of the transistor TR13 and the resistor R16 is connected via the above-described parallel circuit arranged by the damping resistor R10 and capacitor C10 to the DC/AC inverter circuit 3.

With the above-described circuit arrangement, when the NPN transistor TR11 is turned ON in response to the pulse signal derived from the pulse width modulation oscillator 19, the transistor TR12 is turned ON to output its output voltage "$V_{OUT}$" of 15 V. As a result, the gate voltage $V_{GE}$ of the insulated gate bipolar transistor 13 is increased. Conversely, when the transistor TR11 is turned OFF in response to the pulse signal derived from the pulse width modulation oscillator 19, the transistor TR13 is turned ON to output another output voltage "$V_{OUT}$" of 0 V. As a consequence, the gate voltage $V_{GE}$ of the insulated gate bipolar transistor 13 is lowered.

SWITCHING OPERATION

An overall operation of the electromagnetic cooker according to the preferred embodiment will now be explained with reference to the circuit diagram shown in FIG. 4 and waveform charts shown in FIGS. 6A to 6C.

Figure 6A:
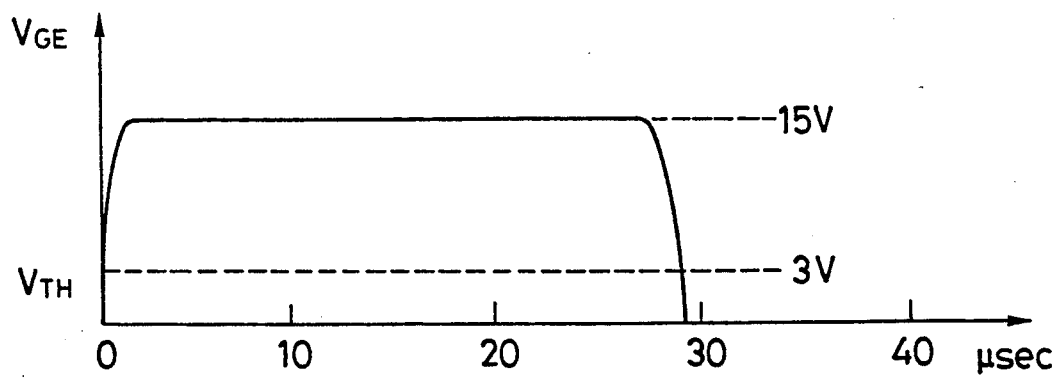
FIGS. 6A to 6C are waveform charts for representing no occurrence of ringing effect in the switching operation of the electromagnetic cooker shown in FIG. 4.
Figure 6B:
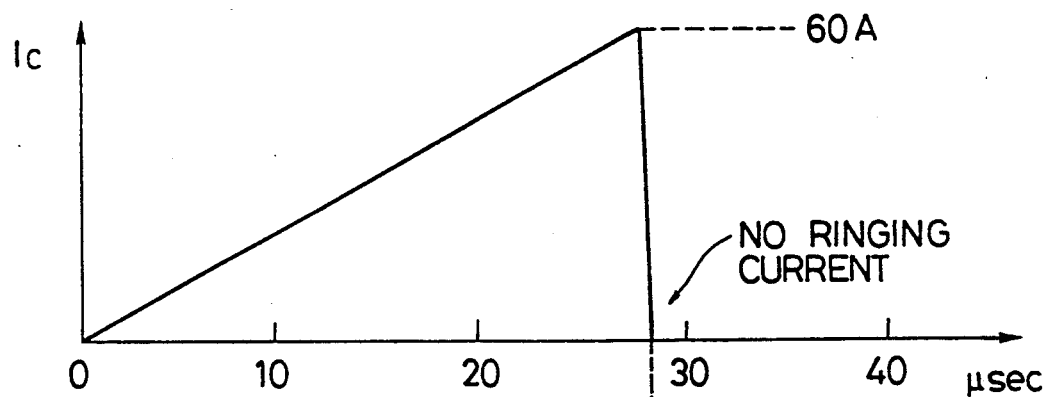
Figure 6C:
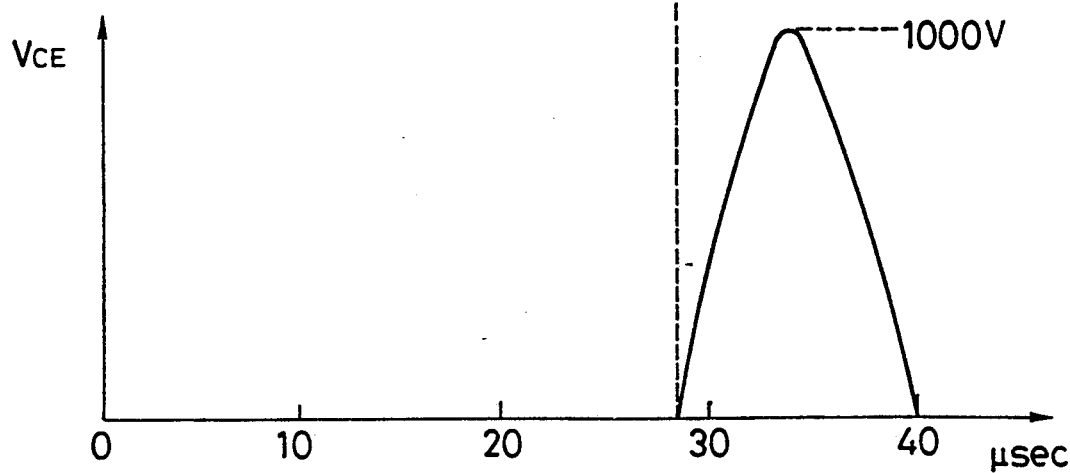

When the output voltage "$V_{OUT}$" of 15 V is output from the gate driver circuit 15, the capacitance existing between the gate electrode and emitter of the insulated gate bipolar transistor 13 is charged via the parallel circuit arranged by the resistor R10 and capacitor C10 and so that the gate voltage $V_{GE}$ is increased as illustrated in FIG. 6A. When the gate voltage $V_{GE}$ exceeds over the threshold voltage "$V_{TH}$", then the insulated gate bipolar transistor 13 is turned ON. Once the insulated gate bipolar transistor 13 is turned ON, the collector current "$I_C$" flowing through the insulated gate bipolar transistor 13 is increased in a linear form as shown in FIG. 6B.

When the output voltage "$V_{OUT}$" from the gate driver circuit 15 is set to a zero volt after a predetermined time period, for instance, approximately 28 microseconds has passed, the electrons which have been stored between the gate electrode and emitter of the gate insulated bipolar transistor 13 are quickly removed to the capacitor C10 of the above -described parallel circuit. The damping resistor R10 of this parallel circuit is to prevent an occurrence of the ringing effect caused by the magnetic flux produced from the heating coil 7. According to the feature of the present invention, when the output voltage "$V_{OUT}$" from the gate driver circuit 15 is set to a zero voltage, the gate voltage "$V_{GE}$" is immediately reduced to a zero volt, as represented in FIG. 6A, so that the insulated gate bipolar transistor 13 can be surely turned OFF. Once the insulted gate bipolar transistor 13 is turned OFF, the voltage appearing across the emitter and collector of this transistor 13, i.e., resonant voltage $V_{CE}$ can be obtained as a sinusoidal voltage $V_{CE}$ as represented in FIG. 6C. As previously described in detail, since no ringing phenomenon occurs when the insulated gate bipolar transistor 13 is turned OFF, the switching loss, namely power loss of the insulated gate bipolar transistor 13 can be prevented by the parallel circuit arranged by the capacitor C10 and damping resistor R10.

SECOND ELECTROMAGNETIC COOKER

In FIG. 7, there is shown an electromagnetic cooker according to a second preferred embodiment. It should be noted that the same reference numerals shown in FIG. 4 will be employed as those for denoting the same or similar circuit elements shown in the following figures.

A feature of the second electromagnetic cooker is that the series resonant capacitor 9 is connected parallel to the heating coil 7, whereby both the capacitor 9 and heating coil 7 are brought into the parallel resonant condition.

Similarly, the parallel circuit arranged by the damping resistor R10 and capacitor C10 is interposed between the DC/AC inverter circuit 30 and gate driver circuit 15 so as to prevent the power loss occurring when the insulated gate bipolar transistor 13 is turned OFF.

More specifically, in accordance with the electromagnetic cooker shown in FIG. 7, the power consumption during the series resonant operation in the DC/AC inverter 30 can be reduced, as compared with that of the first electromagnetic cooker shown in FIG. 4. That is, when the series resonance phenomenon by the capacitor 9 and heating coil 7 occurs by switching the insulated gate bipolar transistor 13 in the first electromagnetic cooker, the series resonant current flows through the filtering capacitor C1 of the DC source 1. As a result, the power consumption is caused in the internal resistor of the resonant capacitor C1. To the contrary, the series resonant current flows only through the resonant capacitor 9 in the second electromagnetic cooker shown in FIG. 7. As a consequence, such a power consumption can be avoided.

MICROWAVE OVEN

Figure 8:
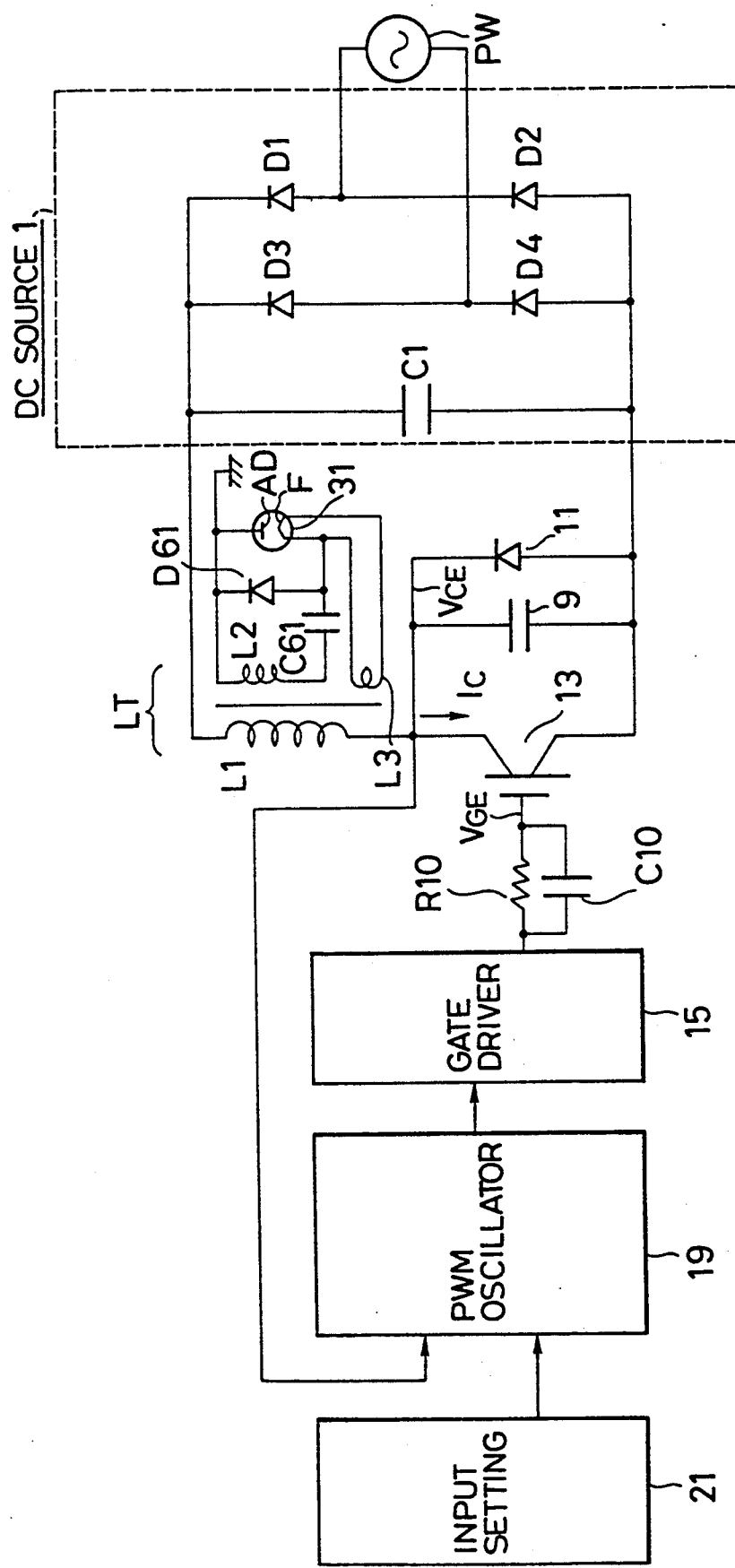

In FIG. 8, there is shown a microwave oven into which the present invention has been applied. In this microwave oven, a step-up transformer "LT" functioning as a high frequency power generating means is connected as the collector load of the insulated gate bipolar transistor 13. In the microwave oven shown in FIG. 8, one end of a primary winding "$L_1$" of the step-up transformer "LT" is connected to the DC source 1, and the other end of this primary winding "$L_1$" is connected to the collector of the insulated gate bipolar transistor 13. A secondary winding "$L_2$" of the step-up transformer "LT" is connected to a voltage doubler rectifier circuit arranged by a rectifying diode D61 and a charging capacitor C61. A plus terminal of the voltage doubler rectifier circuit, namely a cathode of the rectifying diode D61 is connected to an anode "AD" of a magnetron 31. An anode of the rectifying diode D61 is connected to a filament "F" of the magnetron 31.

A heater winding "$L_3$" of the step-up transformer "LT" is connected to the filament "F" of the magnetron 31 so as to supply a predetermined heater voltage to the filament "F" of the magnetron 31.

When the insulated gate bipolar transistor 13 is switched, namely turned ON/OFF at a predetermined high frequency, both the primary winding "$L_1$" and resonant capacitor 9 are brought into the series resonant condition so that the high frequency magnetic field is produced in the primary winding "$L_1$" of the step-up transformer "LT". This high frequency magnetic field induces the high frequency power at the secondary winding "$L_2$" of the step-up transformer "LT". This induced high frequency voltage is stepped up to approximately 4,000 volts by the voltage doubler rectifier circuit. Then, the high power voltage derived from the voltage doubler rectifier circuit is applied to the anode "AD" of the magnetron 31. While a predetermined heating voltage is applied from the heater winding "$L_3$" to the filament "F" of the magnetron 31, thermoelectrons are emitted from this filament "F" to the anode "AD" of the magnetron 31. At this time, the thermoelectrons emitted from the filament "F" are influenced by the magnetic field generated by a solenoid (not shown in detail) wound outside the magnetron 31. As a consequence, the thermoelectrons cannot reach the anode "AD" and again return to the filament "F", depending upon the strength of the magnetic field, with the result that no anode current flows in the magnetron 31. In other words, the anode current of the magnetron 31 can be indirectly controlled by controlling the magnetic field of this solenoid. If the output current produced from this anode current is fed back to the solenoid, a decoupling oscillator can be obtained. Thus the high frequency energy, namely microwaves emitted from the magnetron 31 are projected to an article to be heated (not shown in detail) for the heating purpose.

Similar to the previous preferred embodiments shown in FIGS. 4 and 7, the parallel circuit arranged by the capacitor C10 and damping resistor R10 is interposed between the gate driver circuit 15 and the gate electrode of the gate insulated bipolar transistor 13 in order to prevent the power loss caused when the insulated gate bipolar transistor 13 is turned OFF.

As previously described, in accordance with the microwave oven shown in FIG. 8, the switching loss of the gate insulated bipolar transistor 13 employed in the inverter circuit can be prevented, and also the compact and light-weight microwave oven can be realized.

As has been described in detail, the vibrations contained in the gate voltage to the insulated gate bipolar transistor when the DC/AC inverter employing such a switching element is turned OFF can be suppressed by the damping resistor, and also the electrons remaining between the gate electrode and emitter of the insulated gate bipolar transistor when this transistor is turned OFF can be quickly removed by the electron removing capacitor in accordance with the inverter type high frequency heating apparatus of the invention. Moreover, a compact and light-weight inverter type high frequency heating apparatus can be obtained at low cost.

In other words, according to the present invention, the above-described ringing effect can be suppressed by employing the capacitor C10 to immediately absorb the residual electrons existing between the gate electrode and emitter of the insulated gate bipolar transistor when this transistor is turned OFF. In addition, as the capacitance of the capacitor C10 is designed to be equal to that of the signal path between the gate electrode and emitter of the insulated gate bipolar transistor, the resonant point of the series resonant capacitor 9 and heating coil 7 can be shifted. More specifically, since it is obvious that the heating coil 7 of the compact electromagnetic cooker must be positioned adjacent to the insulated gate bipolar transistor in order to realize a compact electromagnetic cooker, the adverse influence caused by the ringing effect of the switching element can be effectively suppressed in accordance with the present invention.

What is claimed is:

1. A high frequency heating apparatus comprising:
    DC (direct current)-to-AC (alternating current) inverter means, having an insulated gate bipolar transistor, for inverting DC power into high frequency AC power utilizing a resonant phenomenon by switching the insulated gate bipolar transistor at a predetermined high frequency, the AC power heating an article using electromagnetic induction;
    driver means for driving a gate electrode of the insulated gate bipolar transistor for the switching;
    removing means, interposed between the driver means and the gate electrode of the insulated gate bipolar transistor, for removing an electron remaining between the gate electrode of the insulated gate bipolar transistor and an emitter thereof when the insulated gate bipolar transistor is turned OFF; and,
    suppressing means, connected in parallel to the removing means, for suppressing vibrations of a gate voltage of the insulated gate bipolar transistor when the insulated gate bipolar transistor is turned OFF.

2. A high frequency heating apparatus as claimed in claim 1, wherein said removing means is a capacitor.

3. A high frequency heating apparatus as claimed in claim 2, wherein a capacitance of said capacitor is substantially equal to a gate-to-emitter capacitance of said insulated gate bipolar transistor.

4. A high frequency heating apparatus as claimed in claim 2, wherein a capacitance of said capacitor is approximately 0.01 microfarads.

5. A high frequency heating apparatus as claimed in claim 1, wherein said suppressing means is a damping resistor.

6. A high frequency heating apparatus as claimed in claim 5, wherein a resistance value of said damping resistor is approximately 10 ohms.

7. A high frequency heating apparatus as claimed in claim 1, further comprising:
    a pulse width modulation oscillator, connected to said driver means, for generating an oscillating pulse signal having a modulated width in response to a switching voltage of the insulated gate bipolar transistor to supply the pulse signal to the driver means, such that said driver means is operated in a pulse width modulated mode.

8. A high frequency heating apparatus as claimed in claim 1, wherein said driver means includes bipolar transistors.

9. A high frequency heating apparatus as claimed in claim 1, wherein said DC/AC inverter means includes a heating coil and a resonant capacitor series-connected to the heating coil to cause the resonant phenomenon while the insulated gate bipolar transistor is switched, such that electromagnetic induction occurs in the heating coil.

10. A high frequency heating apparatus as claimed in claim 1, wherein said DC/AC inverter means includes a heating coil and a resonant capacitor parallel-connected to the heating coil in order to cause the resonant phenomenon while the insulated gate bipolar transistor is switched, such that electromagnetic induction occurs in the heating coil.

11. A high frequency heating apparatus comprising:
    DC (direct current)-to-AC (alternating current) inverter means, having an insulated gate bipolar transistor, for inverting DC power into high frequency AC power utilizing a resonant phenomenon by switching the insulated gate bipolar transistor at a predetermined high frequency, the C power heating an article using dielectric heat;
    driver means for driving a gate electrode of the insulated gate bipolar transistor for the switching;
    removing means, interposed between the driver means and the gate electrode of the insulated gate bipolar transistor, for removing an electron remaining between the gate electrode of the insulated gate bipolar transistor and an emitter thereof when the insulated gate bipolar transistor is turned OFF; and,
    suppressing means, connected in parallel to the removing means, for suppressing vibrations of a gate voltage of the insulated gate bipolar transistor when the insulated gate bipolar transistor is turned OFF.

12. A high frequency heating apparatus as claimed in claim 11, wherein said DC/AC inverter means includes a step-up transformer having a primary winding connected to a collector of the insulated gate bipolar transistor and a secondary winding to which a magnetron is coupled, so as to cause the resonant phenomenon while the insulated gate bipolar transistor is switched, such that dielectric heating is achieved by the magnetron.

13. A high frequency heating apparatus as claimed in claim 11, wherein the removing means is a capacitor.

14. A high frequency heating apparatus as claimed in claim 13, wherein a capacitance of the capacitor is substantially equal to a gate-to-emitter capacitance of the insulated gate bipolar transistor.

15. A high frequency heating apparatus as claimed in claim 13, wherein a capacitance of the capacitor is approximately 0.01 microfarads.

16. A high frequency heating apparatus as claimed in claim 11, wherein the suppressing means is a damping resistor.

17. A high frequency heating apparatus as claimed in claim 16, wherein a resistance value of the damping resistor is approximately 10 ohms.

18. A high frequency heating apparatus as claimed in claim 11, further comprising:

a pulse width modulation oscillator, connected to the driver means, for generating an oscillating pulse signal having a modulated width in response to a switching voltage of the insulated gate bipolar transistor to supply the pulse signal to the driver means, such that the driver means is operated in a pulse width modulated mode, 19. A high frequency heating apparatus as claimed in claim 11, wherein the driver means includes bipolar transistors.

* * * * *